US011855108B2

(12) United States Patent
Iida et al.

(10) Patent No.: US 11,855,108 B2
(45) Date of Patent: Dec. 26, 2023

(54) SOLID-STATE IMAGING ELEMENT AND ELECTRONIC DEVICE

(71) Applicant: SONY SEMICONDUCTOR SOLUTIONS CORPORATION, Kanagawa (JP)

(72) Inventors: Satoko Iida, Kanagawa (JP); Yoshiaki Kitano, Kanagawa (JP); Kengo Nagata, Kanagawa (JP); Toshiaki Ono, Kanagawa (JP); Tomohiko Asatsuma, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 405 days.

(21) Appl. No.: 17/250,708

(22) PCT Filed: Sep. 2, 2019

(86) PCT No.: PCT/JP2019/034348
§ 371 (c)(1),
(2) Date: Feb. 22, 2021

(87) PCT Pub. No.: WO2020/050195
PCT Pub. Date: Mar. 12, 2020

(65) Prior Publication Data
US 2021/0202545 A1 Jul. 1, 2021

(30) Foreign Application Priority Data
Sep. 4, 2018 (JP) .................................. 2018-165458

(51) Int. Cl.
*H01L 27/146* (2006.01)

(52) U.S. Cl.
CPC .... *H01L 27/1461* (2013.01); *H01L 27/14636* (2013.01); *H01L 27/14643* (2013.01)

(58) Field of Classification Search
CPC .......... H01L 27/1461; H01L 27/14636; H01L 27/14643; H01L 27/14689;
(Continued)

(56) References Cited

U.S. PATENT DOCUMENTS 10,805,567 B2 * 10/2020 Parks ................ H01L 27/14643
2009/0140368 A1 6/2009 Miura
(Continued)

FOREIGN PATENT DOCUMENTS

CN 101447527 A 6/2009
CN 105409002 A 3/2016
(Continued)

OTHER PUBLICATIONS

International Search Report and Written Opinion of PCT Application No. PCT/JP2019/034348, dated Nov. 19, 2019, 11 pages of ISRWO.

*Primary Examiner* — David Vu
(74) *Attorney, Agent, or Firm* — CHIP LAW GROUP (57) ABSTRACT

A solid-state imaging element which detects visible light and ultraviolet light in one pixel provides improved resolution. First and second photoelectric conversion elements each perform photoelectric conversion of incident light. A first accumulation part accumulates electric charges that are photoelectrically converted by the first photoelectric conversion element second accumulation part is disposed on one face of a substrate and accumulates electric charges that are photoelectrically converted by the second photoelectric conversion element. A connection part is connected to the second accumulation part and transfers the electric charges accumulated in the second accumulation part to another face of the substrate.

11 Claims, 11 Drawing Sheets

(58) Field of Classification Search
CPC ........... H01L 27/14612; H01L 27/1463; H01L 27/14638; H01L 27/14641; H01L 27/1464; H04N 25/70; H04N 25/77
See application file for complete search history.

(56) References Cited

U.S. PATENT DOCUMENTS

| | | |
|---|---|---|
| 2011/0163406 A1 | 7/2011 | Miura |
| 2016/0204156 A1 | 7/2016 | Togashi |
| 2017/0138786 A1 | 5/2017 | Shimizu et al. |
| 2018/0006073 A1 | 1/2018 | Togashi |
| 2018/0076243 A1 | 3/2018 | Tashiro |
| 2019/0057997 A1 | 2/2019 | Togashi et al. |
| 2019/0181165 A1 | 6/2019 | Tashiro |

FOREIGN PATENT DOCUMENTS

| | | |
|---|---|---|
| CN | 106104232 A | 11/2016 |
| CN | 107409184 A | 11/2017 |
| CN | 108604592 A | 9/2018 |
| CN | 110010549 A | 7/2019 |
| CN | 110047856 A | 7/2019 |
| CN | 110047857 A | 7/2019 |
| JP | 2009-135314 A | 6/2009 |
| JP | 2009-170615 A | 7/2009 |
| JP | 2015-038931 A | 2/2015 |
| KR | 10-2016-0045054 A | 4/2016 |
| KR | 10-2018-0112766 A | 10/2018 |
| WO | 2015/025723 A1 | 2/2015 |
| WO | 2015/151651 A1 | 10/2015 |
| WO | 2016/147837 A1 | 9/2016 |
| WO | 2017/138197 A1 | 8/2017 |

* cited by examiner

SOLID-STATE IMAGING ELEMENT AND ELECTRONIC DEVICE

CROSS REFERENCE TO RELATED APPLICATIONS

This application is a U.S. National Phase of International Patent Application No. PCT/JP2019/034348 filed on Sep. 2, 2019, which claims priority benefit of Japanese Patent Application No. JP 2018-165458 filed in the Japan Patent Office on Sep. 4, 2018. Each of the above-referenced applications is hereby incorporated herein by reference in its entirety.

TECHNICAL FIELD

The present technology relates to a solid-state imaging element. More specifically, the present technology relates to a solid-state imaging element that photoelectrically converts light from an object, and an electronic device.

BACKGROUND ART

A solid-state imaging element has been known which is provided with a function of detecting not only visible light but also ultraviolet light. For example, a technology has been proposed in which an ultraviolet photosensitive element and a visible light photosensitive element are formed on a semiconductor substrate having an SOI (Silicon On insulator) structure into a single chip (for example, see PTL 1).

CITATION LIST

Patent Literature

[PTL 1]
JP 2009-170615A

SUMMARY

Technical Problems

With the conventional technology described above, both the visible light photosensitive element and the ultraviolet photosensitive element are formed on a silicon substrate. However, the conventional technology has a problem that it provides a structure in which light detection regions for individually detecting ultraviolet light and visible light are allocated separately in a planar fashion, resulting in a decrease in resolution. Moreover, since Bayer arrangement is not possible in the configuration, it poses another problem of a difficulty in performing color interpolation processing, in addition to the decreased resolution.

The present technology has been created in view of such a situation and is aimed at improving the resolution of a solid-state imaging element that detects visible light and ultraviolet light.

Solution to Problems

The present technology has been made to solve the above-described problems, and a first aspect of the present technology is a solid-state imaging element and an electronic device. The solid-state imaging element and the electronic device each include a first photoelectric conversion element, a first accumulation part configured to accumulate electric charges photoelectrically converted by the first photoelectric conversion element, a second photoelectric conversion element, a second accumulation part disposed on one face of a substrate and configured to accumulate electric charges photoelectrically converted by the second photoelectric conversion element, and a connection part connected to the second accumulation part and configured to transfer the electric charges accumulated in the second accumulation part to another face of the substrate. This configuration brings about an effect in which photoelectric conversion can be performed individually in both faces of the substrate.

Further, in the first aspect, light nay be incident from the one face of the substrate, the first photoelectric conversion element may photoelectrically convert light in a visible light region, and the second photoelectric conversion element may photoelectrically convert light in an ultraviolet light region. This configuration brings about an effect in which both visible light and ultraviolet light can be photoelectrically converted in one pixel.

Further, in the first aspect, the substrate may be a silicon substrate, and the second photoelectric conversion element may be formed in a region from a surface of the one face of the substrate to a depth of 40 nanometers of the substrate. In this case, the first photoelectric conversion element may be formed in a region of a surface of the another face of the substrate.

Further, in the first aspect, the connection part may be an electric conductor penetrating the substrate. This configuration brings about an effect in which the electric charges accumulated in the second accumulation part can be transferred, penetrating the substrate, to the another face of the substrate. Note that the electric conductor may be formed including at least tungsten.

Further, in the first aspect, the solid-state imaging element may further include a hafnium film on a surface of the second accumulation part. This configuration brings about an effect that makes possible prevention of reflection and reduction of dark current.

Further, in the first aspect, the solid-state imaging element may further include a potential barrier between the first accumulation part and the second accumulation part. This configuration brings about an effect in which the electric charges of light having different wavelengths can be separated.

Further, in the first aspect, the first photoelectric conversion element may photoelectrically convert light of a plurality of colors different from each other, and the first accumulation part may accumulate the photoelectrically-converted electric charges separately by color, in a direction penetrating the substrate. This configuration brings about an effect in which the need for arraying different filters having different colors can be eliminated.

Furthermore, in the first aspect, the second photoelectric conversion element may be divided into left and right sub-elements, each of the sub-elements performing photoelectric conversion, and the second accumulation part may be divided into sub-parts corresponding to the left and right sub-elements of the second photoelectric conversion element, the sub-parts each accumulating corresponding electric charges. This configuration brings about an effect in which autofocusing can be carried out by detecting a phase difference based on the electric charges that are converted by the second photoelectric conversion element divided into left and right sub-elements.

DESCRIPTION OF EMBODIMENTS

Hereinafter, modes for carrying out the present technology (hereinafter, referred to as "embodiments") will be described. The description will be made in the following order.

1. First embodiment (an example in which photodiodes for ultraviolet light detection are disposed on the back surface side)

2. Second embodiment (an example in which a hafnium film is deposited on a surface on the back surface side)

3. Third embodiment (an example in which potential barriers are disposed immediately beneath photodiodes for ultraviolet light detection)

4. Fourth embodiment (an example in which photodiodes for visible light detection have an in-silicon vertical spectroscopy structure)

5. Fifth embodiment (an example in which phase difference detection is performed using ultraviolet light signals)

6. Method of manufacturing

1. First Embodiment

[Solid-State Imaging Element]

Figure 1:
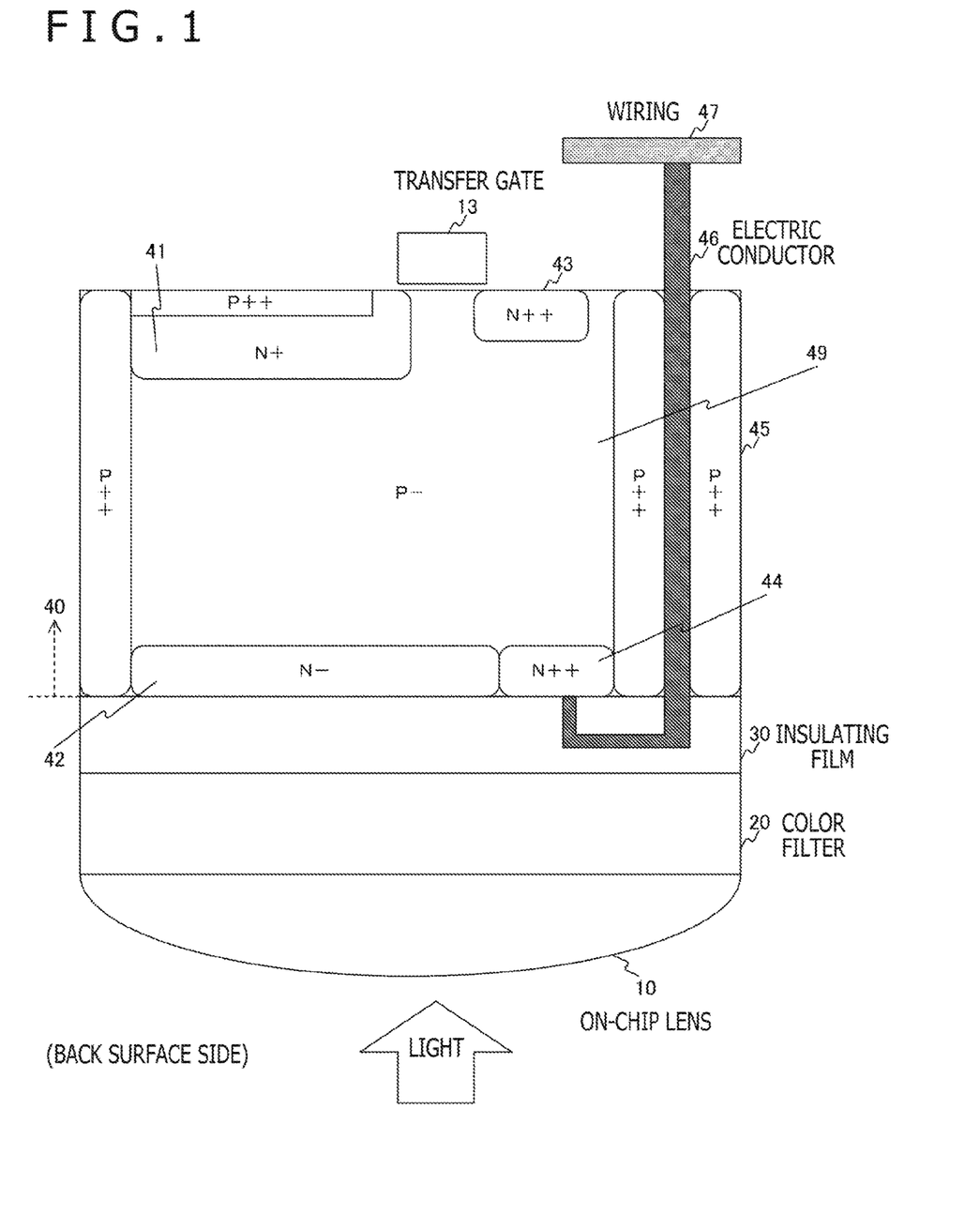
FIG. 1 depicts a diagram illustrating a general example of a cross-sectional view of one pixel of a solid-state imaging element according to a first embodiment of the present technology.

FIG. 1 depicts a diagram illustrating a general example of a cross-sectional view of one pixel of a sold-state imaging element according to a first embodiment of the present technology.

Here, as one example, a back-illuminated type solid-state imaging element is assumed. That is, light from an object is incident from the back surface side (lower side in the figure). In the solid-state imaging element, an on-chip lens 10, a color filter 20, and an insulating film 30 are formed on a semiconductor substrate 40 in this order from the back surface side. It is sufficient if the color of the color filter 20 is one that permits light in an ultraviolet light region and a visible light region to pass through both of the ultraviolet light and visible light regions. For example, the color filter may be a clear (white) filter. Alternatively, the color of the filter may be green, red, blue, or a complementary color, for example.

The incident light incident from the back surface of the semiconductor substrate 40 via these parts is received by photodiodes (Photo Diodes: PDs) inside the semiconductor substrate 40. The photodiodes generate electric charges according to the incident light. The semiconductor substrate 40 includes a photodiode 41 on the front surface side which photoelectrically converts visible light, and a photodiode 42 on the back surface side which photoelectrically converts ultraviolet light. The photodiode 41 and the photodiode 42 are gently separated by a P-type well 49. In particular, photoelectric charges converted from light with wavelengths equal to or not shorter than 400 nm (blue light) move to the photodiode 41 due to the potential gradient. Note that the photodiode 41 is one example of a first photoelectric conversion element described in the claims and the photodiode 42 is one example of a second photoelectric conversion element described in the claims.

The semiconductor substrate 40 is, for example, a P-type silicon substrate. The photodiode 41 includes an N+ region formed in the P-type silicon substrate, and a P++ region formed in the N+ region by diffusion or embedding. Electric charges photoelectrically converted by the photodiode 41 are transferred by a transfer gate 13 to an accumulation part 43 and are accumulated in the accumulation part 43. The accumulation part 43 is formed as an N++ region. Note that the accumulation part 43 is one example of a first accumulation part described in the claims.

Moreover, the photodiode 42 includes an N− region formed in the P-type silicon substrate. Electric charges photoelectrically converted by one photodiode 42 are accumulated in an accumulation part 44. The accumulation part 44 is formed as an N++ region. Note that the accumulation part 44 is one example of a second accumulation part described in the claims.

Here, the absorption rate, by silicon, of ultraviolet light with wavelengths up to 400 nm is approximately 100% in a region where the in-silicon depth ranges from 0 (zero) to 40 nm. Therefore, the photodiode 42 for ultraviolet light detection which is disposed on the back surface side is preferably such that its depletion region is present in a region from the back surface side of the semiconductor substrate 40 to a depth of approximately 40 nm.

The electric charges accumulated in the accumulation part 44 are transferred via an electric conductor 46 to a wiring 47 on the front surface side. The electric conductor 46 is a conductive member that is connected to the accumulation part 44 and penetrates the semiconductor substrate 40. The electric conductor 46 is formed in a center portion of a through electrode surrounded by a pinning region 45 (P++) for preventing dark current. Examples of the electric conductor 46 may adopt a metal material such as tungsten M. Note that the electric conductor 46 is one example of a connection part described in the claims.

With such a structure, in one pixel, it is possible to detect ultraviolet light with the photodiode 42 disposed on the back surface side of the semiconductor substrate 40 and to detect visible light with the photodiode 41 disposed on the front surface side of the semiconductor substrate 40. Then, electric charges photoelectrically converted are transferred, via the transfer gate 13 and the electric conductor 46, to a circuit on the front surface side of the semiconductor substrate 40.

[Equivalent Circuit]

Figure 2:
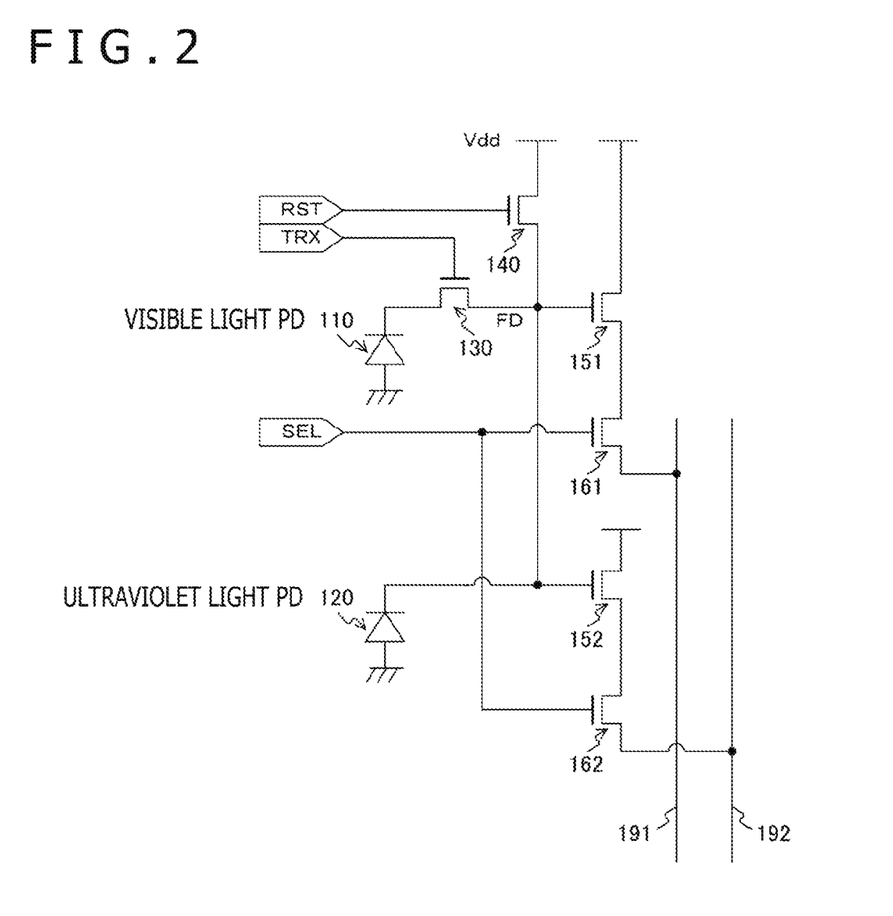
FIG. 2 depicts a diagram illustrating an example of an equivalent circuit of one pixel of the solid-state imaging element according to the first embodiment of the present technology.

FIG. 2 depicts a diagram illustrating an example of an equivalent circuit of one pixel of the solid-state imaging element according to the first embodiment of the present technology.

The pixel includes a visible light photodiode 110, an ultraviolet light photodiode 120, a transfer transistor 130, a reset transistor 140, amplification transistors 151 and 152, and selection transistors 161 and 162.

Moreover, for the pixel, there are disposed three signal lines, i.e., a transfer signal line TRX, a reset signal line RST, and a selection signal line SEL in the row direction, and there are disposed a vertical signal line 191 for visible light and a vertical signal line 192 for ultraviolet light in the column direction. Moreover, the drain sides of the reset transistor 140 and the amplification transistors 151 and 152 are supplied with a power supply voltage Vdd.

The visible light photodiode 110 corresponds to the photodiode 41 described above, and the ultraviolet light photodiode 120 corresponds to the photodiode 42 described above. Anodes of these photodiodes 110 and 120 are grounded.

The transfer transistor 130 is a transistor that transfers electric charges which are photoelectrically converted by the visible light photodiode 110. The transfer transistor 130 is disposed between a cathode of the visible light photodiode 110 and a floating diffusion region FD (Floating Diffusion). The transfer transistor 130 is turned to an ON-state when its gate receives a high-level signal input from a vertical drive circuit via the transfer signal line and transfers, to the floating diffusion region FD, the electric charges which are photoelectrically converted by the visible light photodiode 110.

The floating diffusion region FD is a diffusion layer region that coverts photoelectrically converted charges into a voltage signal. The voltage signal produced by the floating diffusion region FD is connected to a drain of the reset transistor 140 and gates of the amplification transistors 151 and 152. The floating diffusion region FD corresponds to each of the accumulation parts 43 and 44 described above.

The reset transistor 140 is a transistor to reset the voltage of the floating diffusion region FD. The reset transistor 140 is disposed between the power supply voltage Vdd and the floating diffusion region FD. The reset transistor 140 is turned to an ON-state when its gate receives a high-level signal input from the vertical drive circuit to the reset signal line and resets the voltage of the floating diffusion region FD to the power supply voltage Vdd.

The amplification transistors 151 and 152 are each a transistor to amplify the voltage signal of the floating diffusion region FD. Each of the amplification transistors 151 and 152 amplifies the voltage signal of the floating diffusion region FD and outputs, as a pixel signal, the thus-amplified signal to the corresponding one of the selection transistors 161 and 162.

The selection transistors 161 and 162 are transistors to select the pixel. The selection transistors 161 and 162 are disposed between the amplification transistors 151 and 152 and the vertical signal lines 191 and 192, respectively. The selection transistors 161 and 162 are turned to an ON-state when their gates receive a high-level signal input from the vertical drive circuit to the selection signal line and output the respective voltage signals, which are amplified by the amplification transistors 151 and 152, to the vertical signal lines 191 and 192, respectively.

[Operation]

Figure 3:
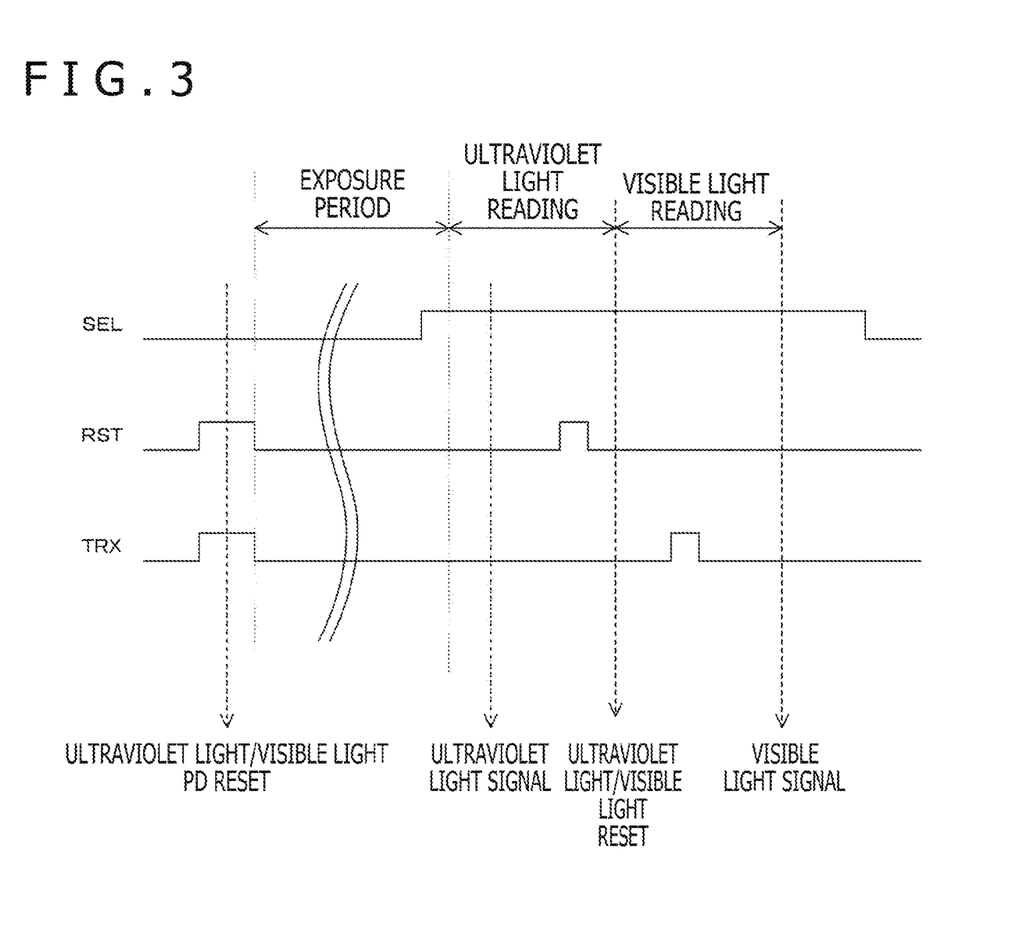
FIG. 3 depicts a chart illustrating an example of operation timing of the solid-state imaging element according to the first embodiment of the present technology.

FIG. 3 depicts a chart illustrating an example of operation timing of the solid-state imaging element according to the first embodiment of the present technology.

First, the reset signal line RST and the transfer signal line TRX are asserted, thereby resetting the electric charges of both the visible light photodiode 110 and the ultraviolet light photodiode 120.

Electric charges which are photoelectrically converted during an exposure are accumulated individually in the visible light photodiode 110 and the ultraviolet light photodiode 120. In the visible light photodiode 110, light in a visible light region is accumulated according to the absorption rate by silicon. In the ultraviolet light photodiode 120, light in an ultraviolet light region is accumulated.

Then, after a lapse of an exposure period, the selection signal line SEL is asserted to select a pixel. This causes the ultraviolet light charges accumulated first in the ultraviolet light photodiode 120 to be supplied to the amplification transistor 152, thereby outputting an ultraviolet light signal to the vertical signal line 192.

After that, the reset signal line RST is asserted to reset the visible light and the ultraviolet light, and then the visible light is detected by the visible light photodiode 110. Then, when the transfer signal line TRX is asserted, the visible light charges are supplied to the amplification transistor 151, thereby outputting a visible light signal to the vertical signal line 191.

In such a way, according to the first embodiment of the present technology, in one pixel, it is possible to detect ultraviolet light with the photodiode 42 disposed on the back surface side of the semiconductor substrate 40 and to detect visible light with the photodiode 41 disposed on the front surface side. The ultraviolet light charges, which have been photoelectrically converted by the photodiode 42 disposed on the back surface side, are efficiently transferred to a circuit on the front surface side of the semiconductor substrate 40 via the electric conductor 46.

That is, unlike configurations according to conventional technologies in which light detection regions for individually detecting visible light and ultraviolet light are allocated separately in a planar fashion, the one pixel is capable of detecting both visible light and ultraviolet light. This makes it possible to detect signals ranging from ultraviolet light to visible light, without decrease in resolution.

Moreover, in general, signal-to-noise performance (SN ratio) is of utmost importance for visible light signals in imaging or sensing applications. In this regard, according to the embodiment, the adopted structure for the detection of visible light signals is a transfer-type structure as well as a HAD (Hole-Accumulation Diode) structure having an embedded structure in which its surface is covered with a P-type portion. This allows a high SN ratio to be held.

On the other hand, from the standpoint of major applications of ultraviolet light signals, since such a high SN ratio is not always required for them, it is not necessary to adopt the HAD structure and the transfer-type structure. In addition, if the HAD structure is adopted in the silicon surface, the electric charges generated at the outermost surface will be allowed to diffuse into other nodes, causing the charges to possibly fail to serve as signal charges. Meanwhile, according to this embodiment, a HAD structure is not adopted for ultraviolet light and the accumulation part is disposed in a region starting from the outermost surface, which makes it possible to detect ultraviolet light signals without dissipating any signal charges.

Note that it is commonly considered that charges in a deep accumulation layer are difficult to be transferred by means of a vertical transfer gate (VTG: Vertical Transfer Gate). Therefore, as in this embodiment, the back-surface accumulation layer is preferably connected directly from the back surface side to permit the signal detection to be performed.

2. Second Embodiment

Figure 4:
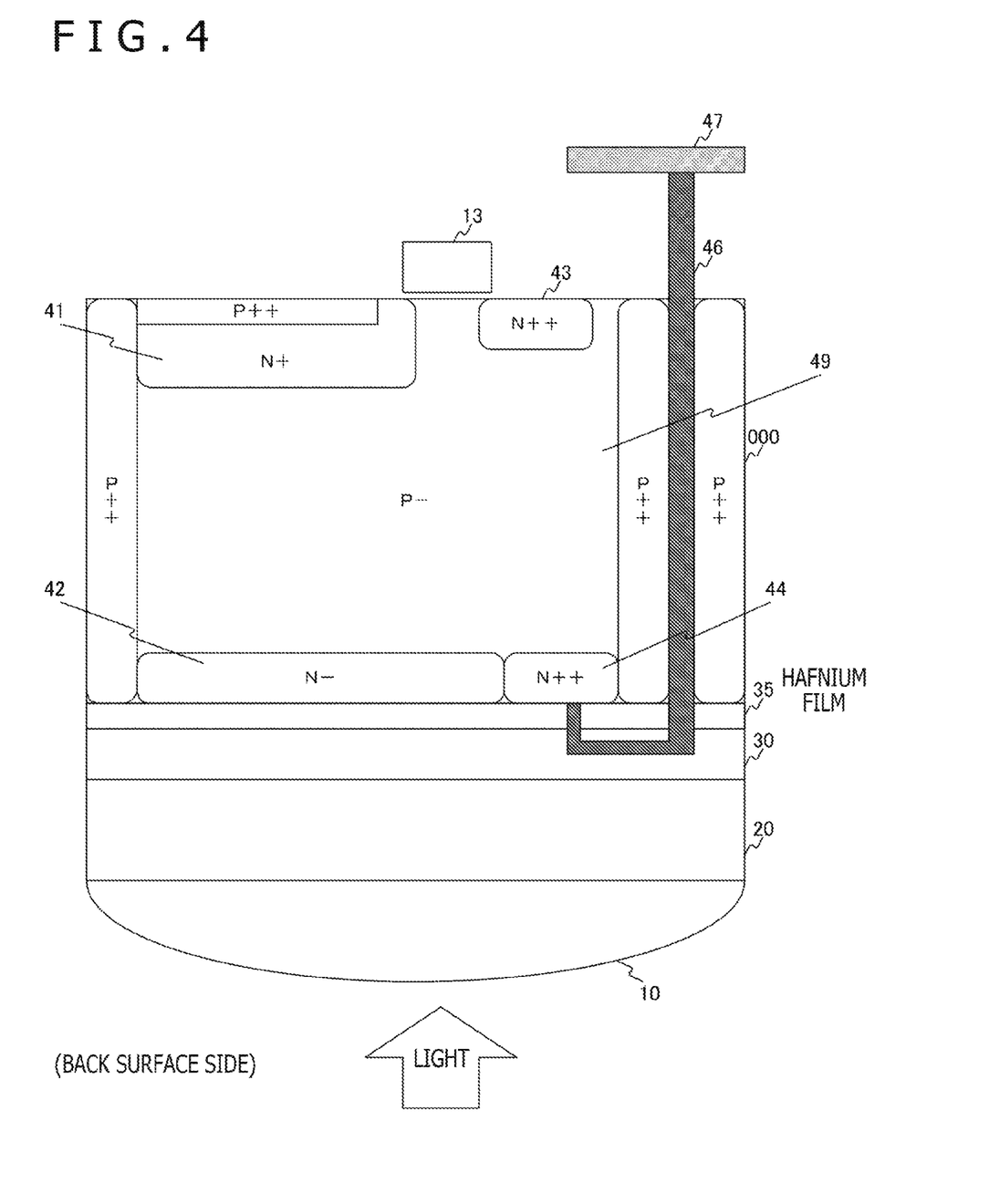
FIG. 4 depicts a diagram illustrating a general example of a cross-sectional view of one pixel of a solid-state imaging element according to a second embodiment of the present technology.

FIG. 4 depicts a diagram illustrating a general example of a cross-sectional view of one pixel of a solid-state imaging element according to a second embodiment of the present technology.

As is the case in the first embodiment described above, the solid-state it element according to the second embodiment is configured such that the photodiode 41 for detecting visible light is disposed on the front surface side of the semiconductor substrate 40 and such that the photodiode 42 for detecting ultraviolet light is disposed on the back surface side. Then, a hafnium film 35 is deposited on a surface on the back surface side of the semiconductor substrate 40. The hafnium film 35 is negatively charged and suppresses defects on the surface. This can prevent reflection and reduce dark current.

Note that the structure other than the hafnium film 35 is the same as that in the first embodiment described above. In addition, the equivalent circuit as well is the same as that in the first embodiment described above.

In such a way, according to the second embodiment of the present technology, the deposition of the hafnium film 35 on the surface on the back surface side of the semiconductor substrate 40 can prevent reflection on the back surface side and reduce dark current.

3. Third Embodiment

Figure 5:
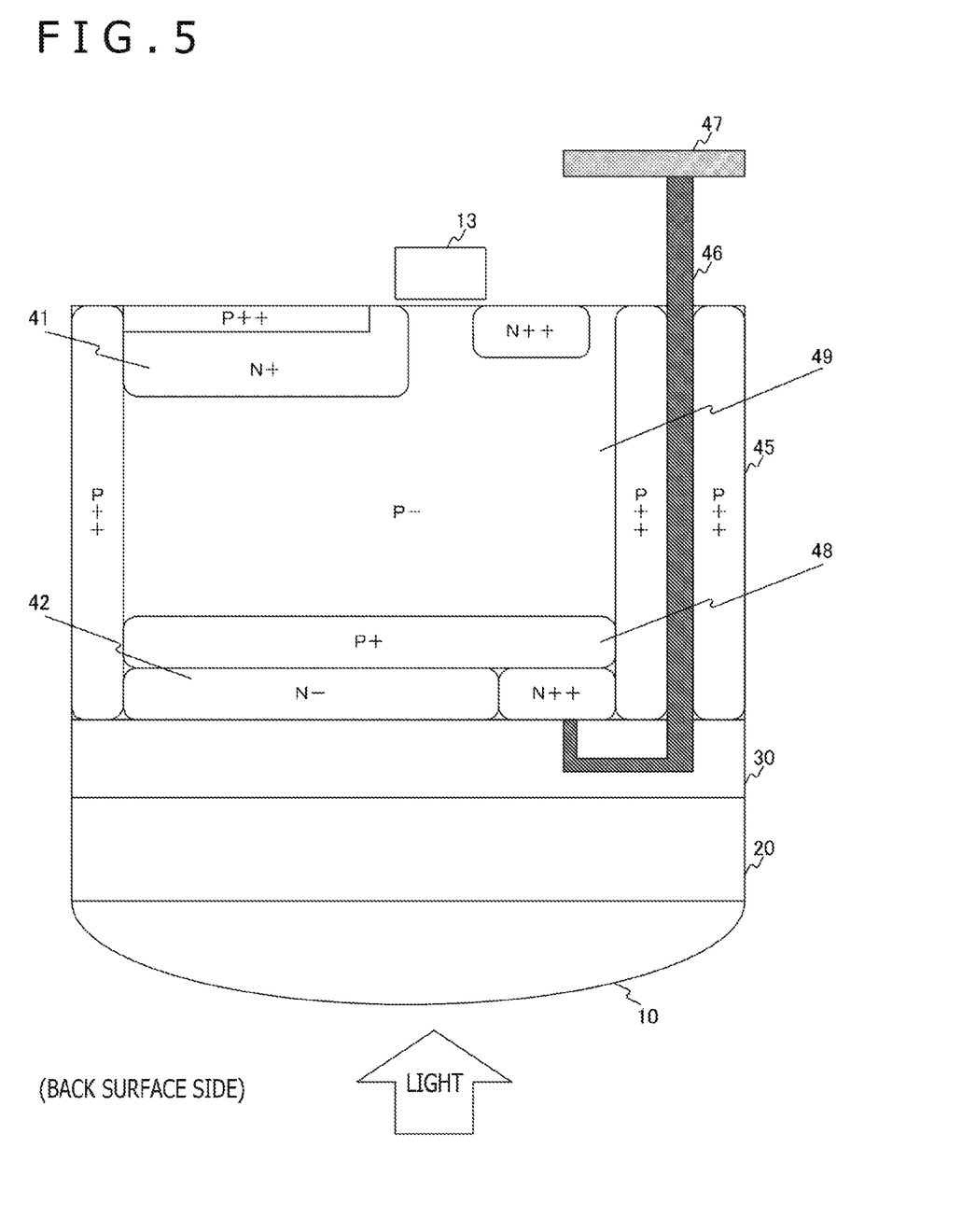
FIG. 5 depicts a diagram illustrating a general example of a cross-sectional view of one pixel of a solid-state imaging element according to a third embodiment of the present technology.

FIG. 5 depicts a diagram illustrating a general example of a cross-sectional view of one pixel of a solid-state imaging element according to a third embodiment of the present technology.

As is the case in the first embodiment described above, the solid-state imaging element according to the third embodiment is configured such that the photodiode 41 for detecting visible light is disposed on the front surface side of the semiconductor substrate 40 and such that the photodiode 42 for detecting ultraviolet light is disposed on the back surface side. Then, a high-concentration P-type layer 48 is disposed immediately beneath the photodiode 42. The high-concentration P-type layer 48 functions as a potential barrier (electric potential barrier) for preventing a depletion layer from spreading. This makes possible easy separation between ultraviolet light charges and blue light charges.

Note that the structure other than the high-concentration P-type layer 48 is the same as that in the first embodiment described above. In addition, the equivalent circuit as well is the same as that in the first embodiment described above.

In such a way, according to the third embodiment of the present technology, the disposition of the high-concentration P-type layer 48, which serves as a potential barrier, immediately beneath the photodiode 42 makes possible easy separation between ultraviolet light charges and blue light charges.

4. Fourth Embodiment

[Solid-State Imaging Element]

Figure 6:
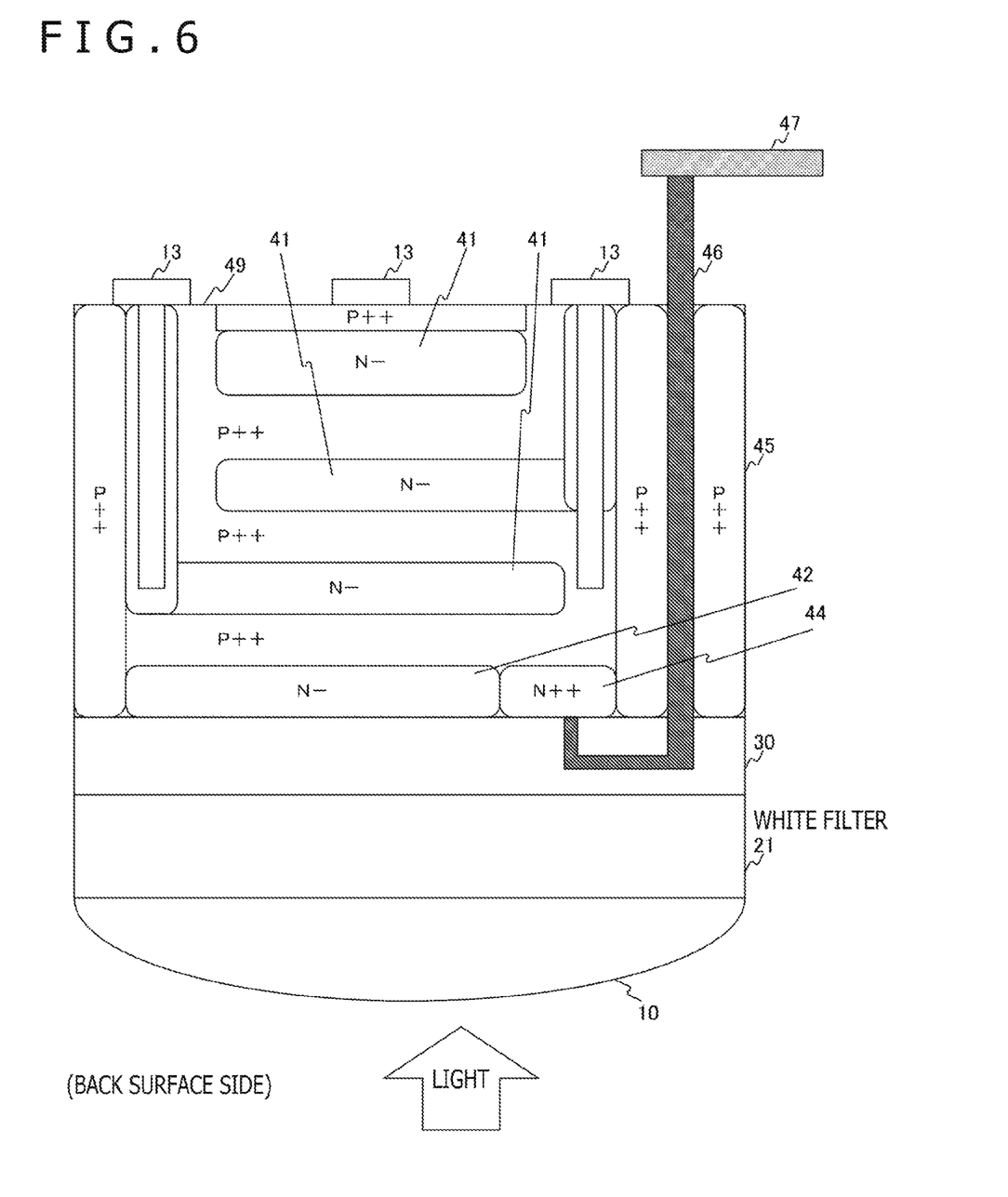
FIG. 6 depicts a diagram illustrating a general example of a cross-sectional view of one pixel of a solid-state imaging element according to a fourth embodiment of the present technology.

FIG. 6 depicts a diagram illustrating a general example of a cross-sectional view of one pixel of a sold-state imaging element according to a fourth embodiment of the present technology.

The solid-state imaging element according to the fourth embodiment is configured such that, as is the case in the first embodiment described above, the photodiode 42 for detecting ultraviolet light is disposed on the back surface side. On the other hand, the photodiode 41 for detecting visible light is divided in three by color. That is, the solid-state imaging element has an in-silicon vertical spectroscopy structure in which red, green, and blue photodiodes 41 are arranged coaxially in the depth direction in this order from the front surface side of the semiconductor substrate 40. In addition, a vertical transfer transistor is used to transfer signal charges of each color.

In this case, a white filter 21 is used in order to take in all colors. This can achieve a further improvement in the ultraviolet light detection rate without worrying about an influence of ultraviolet light transmittance which would otherwise be caused by arraying different filters having different colors.

[Equivalent Circuit]

Figure 7:
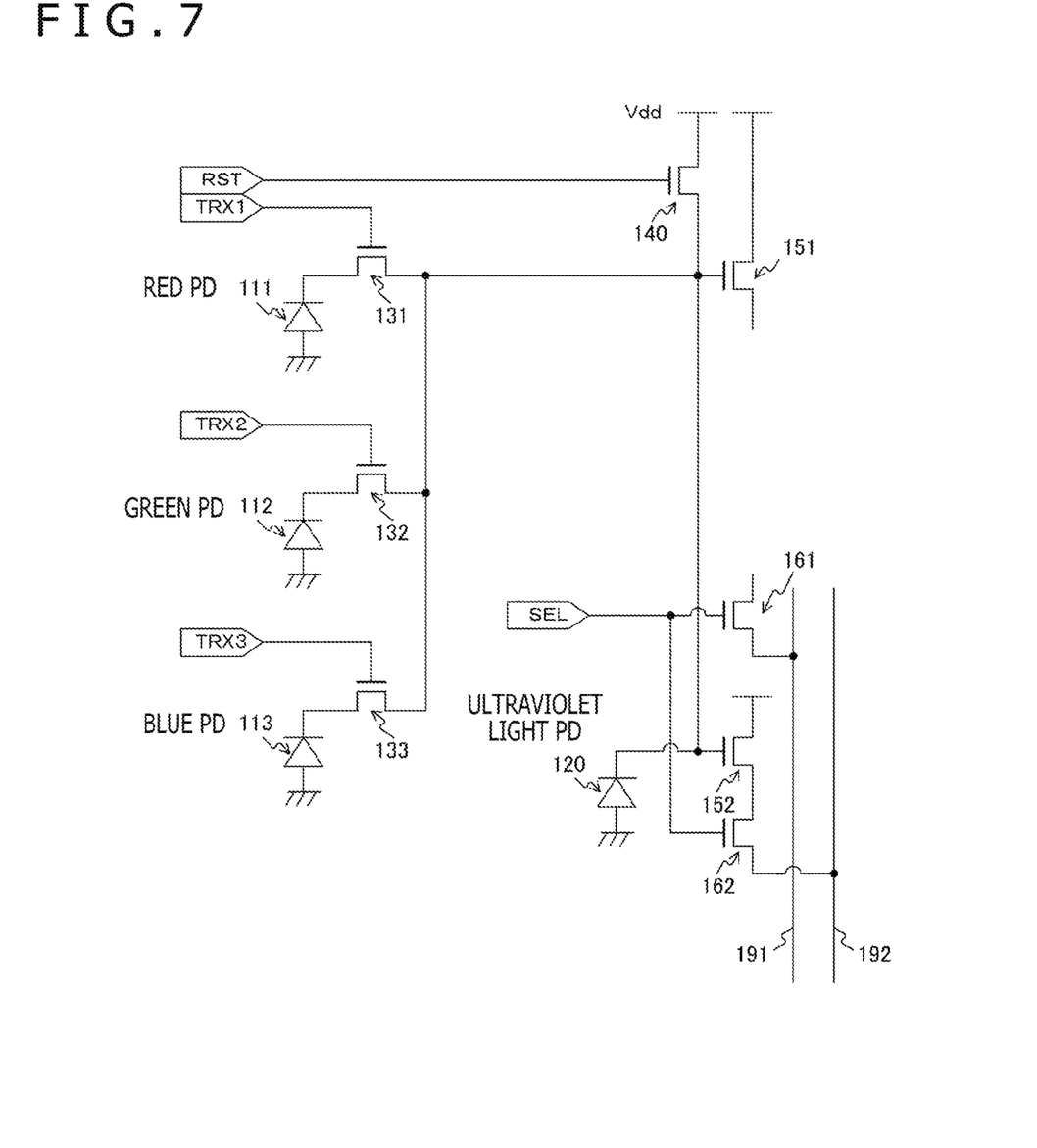
FIG. 7 depicts a diagram illustrating an example of an equivalent circuit of one pixel of the solid-state imaging element according to the fourth embodiment of the present technology.

FIG. 7 depicts a diagram illustrating an example of an equivalent circuit of one pixel of the solid-state imaging element according to the fourth embodiment of the present technology.

Differing from the case in the first embodiment described above, the solid-state imaging element according to the fourth embodiment includes, for each color, a corresponding one of photodiodes 111 to 113 and a corresponding one of transfer transistors 131 to 133.

Transfer signal lines TRX1 to TRX3 are sequentially asserted to supply the red, green, and blue light charges to the amplification transistor 151, thereby obtaining a red signal, a green signal, and a blue signal.

In such a way, according to the fourth embodiment of the present technology, the photodiode 41 for detecting visible light is divided by color, which can achieve a further improvement in the ultraviolet light detection rate without worrying about an influence of ultraviolet light transmittance which would otherwise be caused by arraying different filters having different colors.

5. Fifth Embodiment

[Solid-State Imaging Element]

Figure 8:
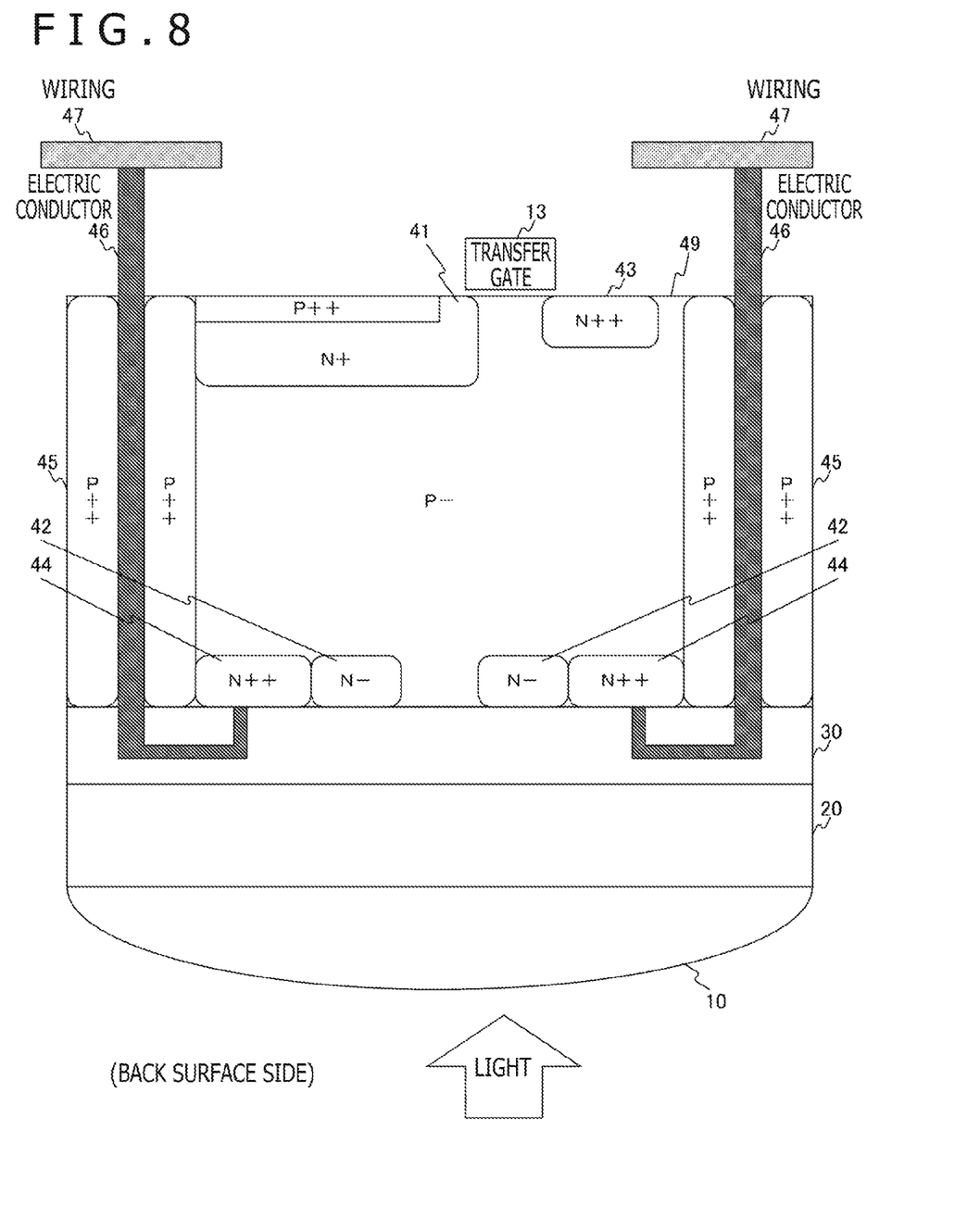
FIG. 8 depicts a diagram illustrating a general example of a cross-sectional view of one pixel of a solid-state imaging element according to a fifth embodiment of the present technology.

FIG. 8 depicts a diagram illustrating a general example of a cross-sectional view of one pixel of a solid-state imaging element according to a fifth embodiment of the present technology.

Differing from the case in the first embodiment described above, the solid-state imaging element according to the fifth embodiment is configured such that the photodiode 42 for detecting ultraviolet light is divided in two, left and right sub-photodiodes, thereby constituting a pixel for detecting a phase difference for autofocusing.

In a conventional phase difference detection pixel, a visible light region is divided in two, causing a decrease in sensitivity to visible light. As described above, the SN ratio is of utmost importance for visible light signals in imaging or sensing applications. In this regard, according to the fifth embodiment, ultraviolet light signals are used for phase difference detection, which can prevent a decrease in sensitivity to visible light signals.

To each of the accumulation parts 44 of the thus-divided left and right sub-photodiodes of the photodiode 42, the electric conductor 46 is connected. Electric charges accumulated in each of the accumulation parts 44 are transferred to the corresponding wiring 47 on the front surface side via the corresponding electric conductor 46.

[Equivalent Circuit]

Figure 9:
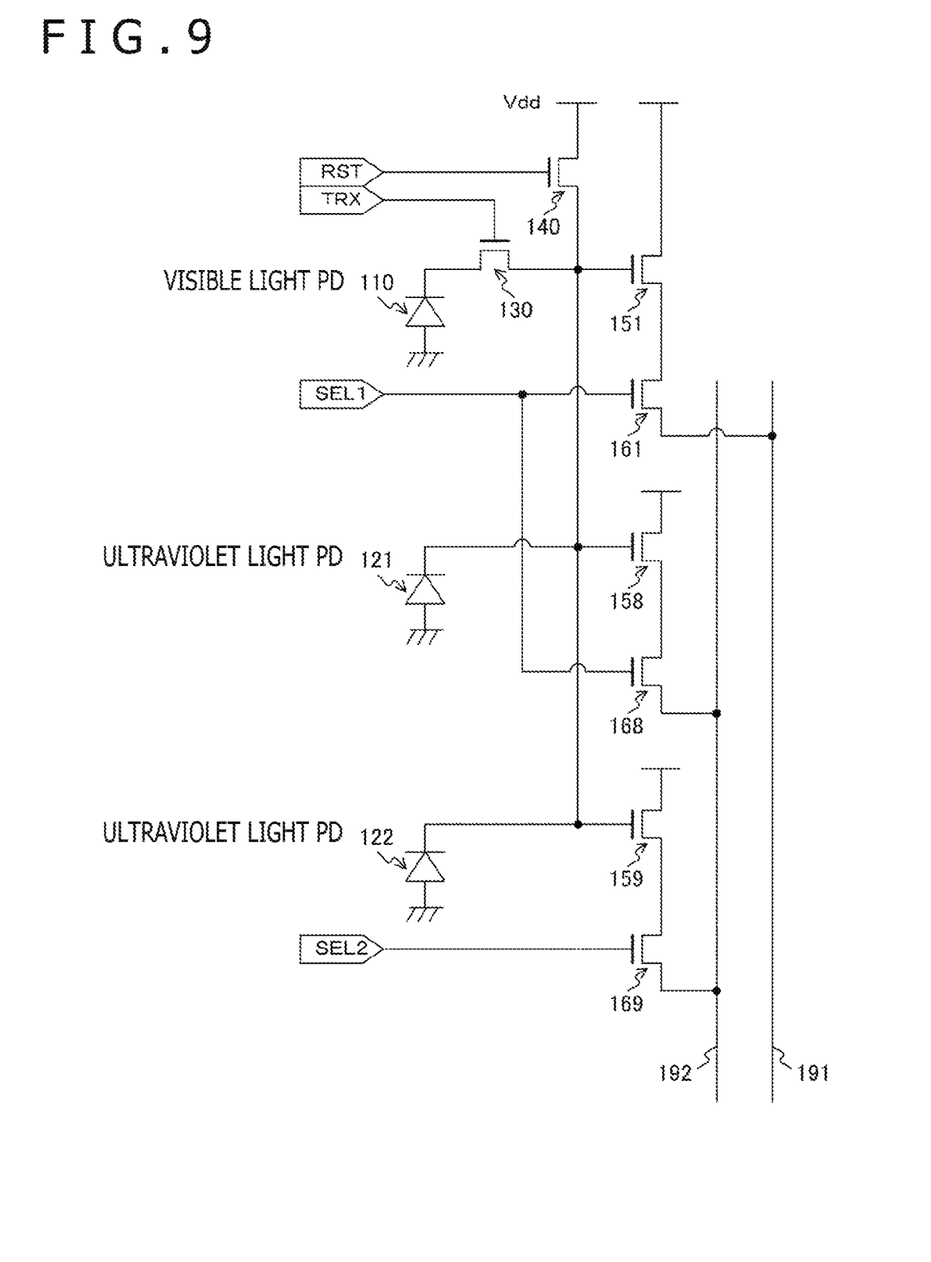
FIG. 9 depicts a diagram illustrating an example of an equivalent circuit of one pixel of the solid-state imaging element according to the fifth embodiment of the present technology.

FIG. 9 depicts a diagram illustrating an example of an equivalent circuit of one pixel of the solid-state imaging element according to the fifth embodiment of the present technology.

Differing from the case in the first embodiment described above, the solid-state imaging element according to the fifth embodiment is configured such that the photodiode for detecting ultraviolet light is divided into two photodiodes 121 and 122 which are to address a phase difference between left and right. Outputs of the photodiodes 121 and 122 are connected to gates of amplification transistors 158 and 159, respectively. Pixel signals amplified by the amplification transistors 158 and 159 are output to selection transistors 168 and 169, respectively.

A selection signal line SEL1 is shared by selection transistors 161 and 168, and the visible light signal and one of the ultraviolet light signals are subjected to common control. On the other hand, a selection signal line SEL2 is connected to a selection transistor 169, and the other of the ultraviolet light signals is controlled independently of the one of the ultraviolet light signals.

In such a way, according to the fifth embodiment of the present technology, the phase difference detection is performed by using the ultraviolet light signals, which can prevent a decrease in sensitivity to visible light signals.

6. Method of Manufacturing

Figure 10A:
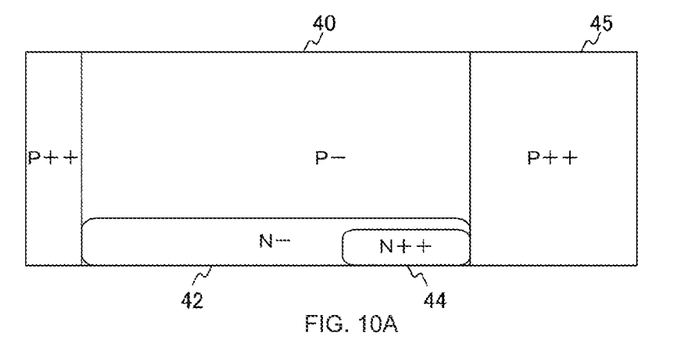
FIGS. 10A, 10B, and 10C depicts diagrams illustrating the first half of an example of a manufacturing process of the solid-state imaging element according to the embodiment of the present technology.
Figure 10B:
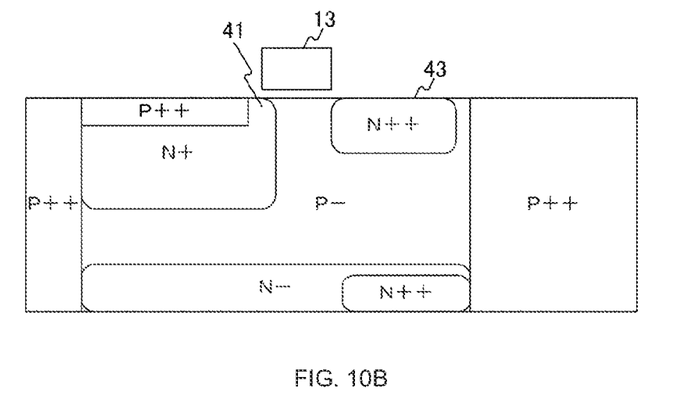
Figure 10C:
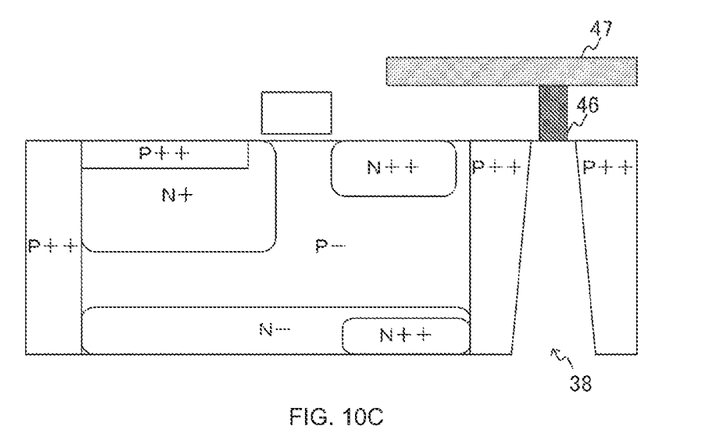
Figure 11A:
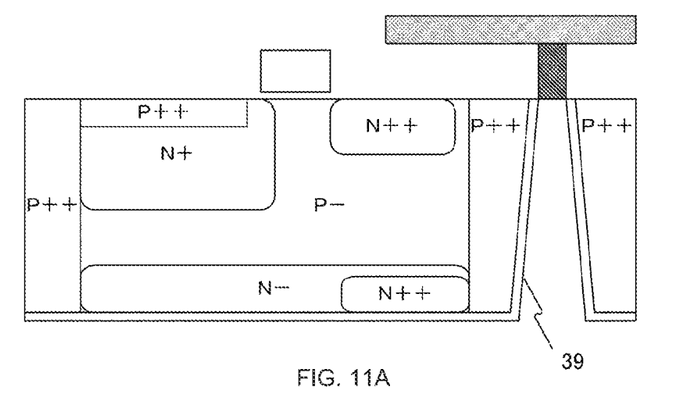
FIGS. 11A, 11B, and 11C depicts diagrams illustrating the latter half of the example of the manufacturing process of the solid-state imaging element according to the embodiment of the present technology.
Figure 11B:
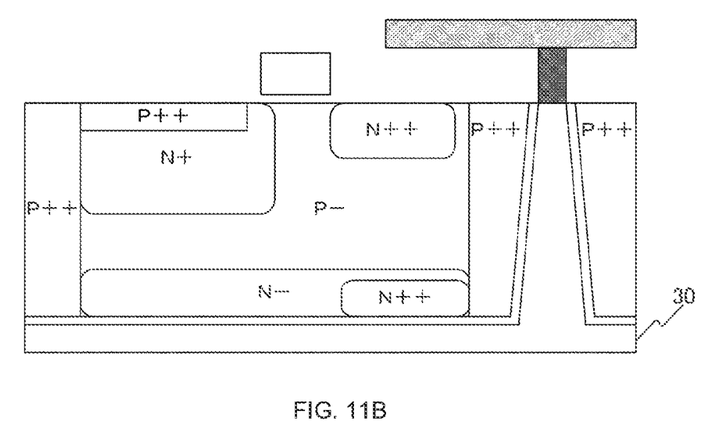
Figure 11C:
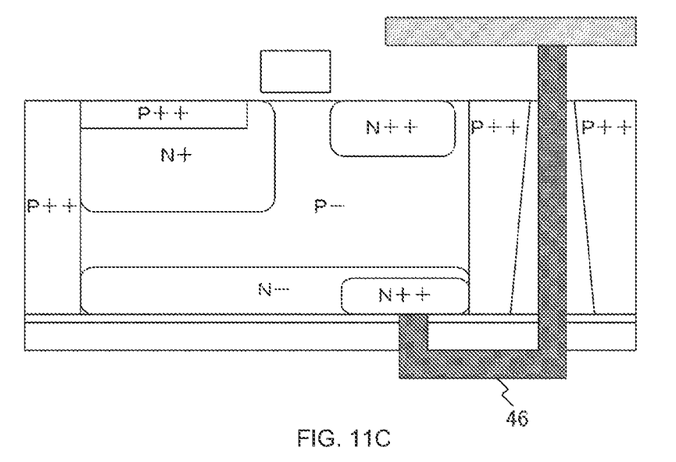

FIGS. 10 and 11 depict diagrams illustrating an example of a manufacturing process of the solid-state imaging element according to the embodiment of the present technology.

First, as depicted in FIG. 10A, the photodiode 42 for detecting ultraviolet light and its accumulation part 44 are formed on the back surface side of the semiconductor substrate 40. In addition, a pinning region 45 that penetrates the semiconductor substrate 40 is formed.

Next, as depicted in FIG. 10B, the photodiode 41 for detecting visible light and its accumulation part 43 are formed on the back surface side of the semiconductor substrate 40. Then, a transfer gate 13 for transferring charges from the photodiode 41 to the accumulation part 43 is formed.

Next, as depicted in FIG. 10C, the electric conductor 46 is formed on the front surface side of the semiconductor substrate 40 so as to be connected to the wiring 47. In addition, a through hole 38 is formed, at a position of the electric conductor 46, from the back surface side of the semiconductor substrate 40 by dry etching or the like.

Next, as depicted in FIG. 11A, a fixed charge film 39 is formed on the back surface side of the semiconductor substrate 40 that includes the through hole 38.

Next, as depicted in FIG. 11B, the insulating film 30 is laminated on the fixed charge film 39 to fill the through hole 38.

Next, as depicted in FIG. 11C, another through hole is formed at a center portion of the insulating film 30 filled in the through hole 38 until reaching the electric conductor 46 on the front surface side, and the electric conductor 46 is embedded in the another through hole. Then, the electric conductor 46 is connected to the accumulation part 44.

By such a manufacturing process, the accumulation part 44 on the back surface side is connected to the wiring 47 on the front surface side via the electric conductor 46. With this configuration, ultraviolet light charges accumulated in the accumulation part 44 on the back surface side are transferred to a circuit on the front surface side and are output as an ultraviolet light signal.

Note that, in the aforementioned embodiments, the solid-state imaging elements have been described in detail. However, the embodiments may be applied to electronic devices which each are equipped with a solid-state imaging element.

Moreover, the above-described embodiments illustrate an example for embodiment of the present technology, and matters in the embodiments and invention-specifying matters in the appended claims have a corresponding relation. Similarly, the invention-specifying matters in the appended claims and matters in the embodiments the present technology to which the same terms are given have a corresponding relation. However, the present technology is not limited to the embodiments and can be embodied by making various modifications to the embodiments without departing from the gist of the present technology.

Furthermore, the processing procedure described in the embodiment described above may be regarded as a method having a series of these procedures, and may be regarded as a program for causing a computer to execute the series of procedures, or a recording medium storing the program. As this recording medium, for example, a CD (Compact Disc), an MD (MiniDisc), a DVD (Digital Versatile Disk), a memory card, a Flu-ray disc (Blu-ray (registered trademark) Disc), or the like can be used.

Note that the effects described in this specification are illustrative only, there is no limitation to the effects, and another effect, may be present.

Note that the present technology may provide the following configurations.

(1)

A solid-state imaging element including:
  a first photoelectric conversion element;
  a first accumulation part configured to accumulate electric charges photoelectrically converted by the first photoelectric conversion element;
  a second photoelectric conversion element;
  a second accumulation part disposed on one face of a substrate and configured to accumulate electric charges photoelectrically converted by the second photoelectric conversion element; and
  a connection part connected to the second accumulation part and configured to transfer the electric charges accumulated in the second accumulation part to another face of the substrate.

(2)
The solid-state imaging element according to above (1),
in which light is incident from the one face of the substrate,
the first photoelectric conversion element photoelectrically converts light in a visible light region, and
the second photoelectric conversion element photoelectrically converts light in an ultraviolet light region.

(3)
The solid-state imaging element according to above (1) or (2),
in which the substrate is a silicon substrate, and
the second photoelectric conversion element is formed in a region from a surface of the one face of the substrate to a depth of 40 nanometers of the substrate.

(4)
The solid-state imaging element according to above (3),
in which the first photoelectric conversion element is formed in a region of a surface of the another face of the substrate.

(5)
The solid-state imaging element according to any one of above (1) to (4),
in which the connection part is an electric conductor penetrating the substrate.

(6)
The solid-state imaging element according to above (5),
in which the electric conductor is formed including at least tungsten.

(7)
The solid-state imaging element according to any one of above (1) to (6), further including:
a hafnium film on a surface of the second accumulation part.

(8)
The solid-state imaging element according to any one of above (1) to (7), further including:
a potential barrier between the first accumulation part and the second accumulation part.

(9)
The solid-state imaging element according to any one of above (1) to (8),
in which the first photoelectric conversion element. photoelectrically converts light of a plurality of colors different from each other, and
the first accumulation part accumulates the photoelectrically-converted electric charges separately by color, in a direction penetrating the substrate.

(10)
The solid-state imaging element according to any one of above (1) to (9),
in which the second photoelectric conversion element is divided into left and right sub-elements, each of the sub-elements performing photoelectric conversion, and
the second accumulation part is divided into sub-parts corresponding to the left and right sub-elements of the second photoelectric conversion element, the sub-parts each accumulating corresponding electric charges.

(11)
An electronic device on which a solid-state imaging element is mounted, the solid-state imaging element including
a first photoelectric conversion element,
a first accumulation part configured to accumulate electric charges photoelectrically converted by the first photoelectric conversion element,
a second photoelectric conversion element,
a second accumulation disposed on one face of a substrate and configured to accumulate electric charges photoelectrically converted by the second photoelectric conversion element, and
a connection part connected to the second accumulation part and configured to transfer the electric charges accumulated in the second accumulation part to another face of the substrate.

REFERENCE SIGNS LIST

10 On-chip lens
13 Transfer gate
20 Color filter
21 White filter
30 Insulating film
35 Hafnium film
38 Through hole
39 Fixed charge film
40 Semiconductor substrate
41, 42 Photodiode
43, 44 Accumulation part
45 Pinning region
46 Electric conductor
47 Wiring
48 High-concentration P-type layer
49 Well
110, 120, 121, 122 Photodiode
130 Transfer transistor
140 Reset transistor
151, 152, 158, 159 Amplification transistor
161, 162, 168, 169 Selection transistor
191, 192 Vertical signal line

The invention claimed is:

1. A solid-state imaging element, comprising:
a first photoelectric conversion element;
a first accumulation part configured to accumulate electric charges photoelectrically converted by the first photoelectric conversion element;
a second photoelectric conversion element;
a second accumulation part on a first face of a substrate and configured to accumulate electric charges photoelectrically converted by the second photoelectric conversion element; and
a connection part connected to the second accumulation part and configured to transfer the electric charges accumulated in the second accumulation part to a second face of the substrate.

2. The solid-state imaging element according to claim 1, wherein light is incident from the first face of the substrate,
the first photoelectric conversion element is configured to photoelectrically convert light in a visible light region, and
the second photoelectric conversion element is configured to photoelectrically convert light in an ultraviolet light region.

3. The solid-state imaging element according to claim 1, wherein the substrate is a silicon substrate, and
the second photoelectric conversion element is in a region from a surface of the first face of the substrate to a depth of 40 nanometers of the substrate.

4. The solid-state imaging element according to claim 3, wherein the first photoelectric conversion element is in a region of a surface of the second face of the substrate.

5. The solid-state imaging element according to claim 1, wherein the connection part is an electric conductor penetrating the substrate.

6. The solid-state imaging element according to claim 5, wherein the electric conductor includes at least tungsten.

7. The solid-state imaging element according to claim 1, further comprising:

a hafnium film on a surface of the second accumulation part.

8. The solid-state imaging element according to claim 1, further comprising:

a potential barrier between the first accumulation part and the second accumulation part.

9. The solid-state imaging element according to claim 1, wherein the first photoelectric conversion element is configured to photoelectrically convert light of a plurality of colors different from each other, and the first accumulation part is further configured to accumulate the photoelectrically converted electric charges separately by color, in a direction penetrating the substrate.

10. The solid-state imaging element according to claim 1, wherein the second photoelectric conversion element is divided into left and right sub-elements, each of the sub-elements performing photoelectrical conversion, and the second accumulation part is divided into sub-parts corresponding to the left and right sub-elements of the second photoelectric conversion element, the sub-parts each accumulate corresponding electric charges.

11. An electronic device on which a solid-state imaging element is mounted, the solid-state imaging element including:

a first photoelectric conversion element, a first accumulation part configured to accumulate electric charges photoelectrically converted by the first photoelectric conversion element, a second photoelectric conversion element, a second accumulation part on a first face of a substrate and configured to accumulate electric charges photoelectrically converted by the second photoelectric conversion element, and a connection part connected to the second accumulation part and configured to transfer the electric charges accumulated in the second accumulation part to a second face of the substrate.

* * * * *